United States Patent [19]
Wood et al.

[11] Patent Number: 5,541,525
[45] Date of Patent: Jul. 30, 1996

[54] CARRIER FOR TESTING AN UNPACKAGED SEMICONDUCTOR DIE

[75] Inventors: Alan G. Wood, Boise; Warren M. Farnworth, Nampa; David R. Hembree, Boise, all of Id.

[73] Assignee: Micron Technology, Inc., Boise, Id.

[21] Appl. No.: 345,064

[22] Filed: Nov. 14, 1994

Related U.S. Application Data

[63] Continuation-in-part of Ser. No. 124,899, Sep. 21, 1993, Pat. No. 5,495,179, which is a continuation-in-part of Ser. No. 46,675, Apr. 14, 1993, Pat. No. 5,367,253, which is a continuation-in-part of Ser. No. 973,931, Nov. 10, 1992, Pat. No. 5,302,891, which is a continuation of Ser. No. 709,858, Jun. 4, 1991, abandoned.

[51] Int. Cl.⁶ .......................... G01R 31/02; G01R 1/073
[52] U.S. Cl. .................. 324/755; 324/754; 324/765
[58] Field of Search ................................. 324/755, 754, 324/757, 158.1, 765

[56] References Cited

U.S. PATENT DOCUMENTS

| | | | |
|---|---|---|---|
| 4,312,117 | 1/1982 | Robillard et al. | 29/589 |
| 4,585,991 | 4/1986 | Reid et al. | 156/647 X |
| 4,899,107 | 2/1990 | Corbett et al. | 324/158 |
| 4,899,921 | 2/1990 | Bendat et al. | 228/105 |
| 4,924,589 | 5/1990 | Leedy | 29/832 |
| 4,937,653 | 6/1990 | Blonder | 357/68 |
| 4,952,272 | 8/1990 | Okino et al. | 156/630 |
| 4,963,225 | 10/1990 | Lehman-Lamer | 156/630 |
| 5,006,792 | 4/1991 | Malhi et al. | 324/755 |
| 5,072,116 | 12/1991 | Kawade et al. | 250/306 |
| 5,073,117 | 12/1991 | Malhi | 439/71 |
| 5,088,190 | 2/1992 | Malhi et al. | 324/755 |
| 5,103,557 | 4/1992 | Leedy | 29/832 |
| 5,123,850 | 6/1992 | Elder et al. | 439/67 |
| 5,173,451 | 12/1992 | Kinsman et al. | 437/209 |
| 5,177,438 | 1/1993 | Littlebury et al. | 324/158 P |
| 5,177,439 | 1/1993 | Liu et al. | 324/158 P |
| 5,249,450 | 10/1993 | Wood et al. | 72/359 |
| 5,264,787 | 11/1993 | Woith et al. | 324/158 |
| 5,302,891 | 4/1994 | Wood et al. | 324/158 |
| 5,323,035 | 6/1994 | Leedy | 257/248 |
| 5,326,428 | 7/1994 | Farnworth et al. | 156/654 |

OTHER PUBLICATIONS

Cloud et al., "Equipment, Processes and Methods For High Volume KGD Production," Semicon West 1994, Mountview, CA, Third Annual Manufacturing, Jul. 2, 1994, text pp. 150, 170.

Yamamoto et al., "Evaluation of New Micro–Connection System Using Microbumps", ISHM '93 Proceedings, pp. 370–378, Nov. 1993.

Miyake et al., "Connectivity Analysis of New Known Good Die Connection Systems Using Microbumps", Technical Paper, Mar. 22, 1993.

Packard Hughes Interconnect, "Science Over Art Our New IC Membrane Test Probe", Jun. 1993.

*Primary Examiner*—Ernest F. Karlsen
*Attorney, Agent, or Firm*—Stephen A. Gratton

[57] ABSTRACT

A carrier for testing an unpackaged semiconductor die is provided. The carrier includes: a base; a temporary interconnect for establishing electrical communication between the die and external test circuitry; a retention mechanism for securing the interconnect to the base; and a force distribution mechanism for biasing the die and interconnect together. The interconnect includes a substrate having raised contact members adapted to penetrate bond pads, or tests pads, on the die to form an electrical connection. Conductive traces are formed on the substrate in electrical communication with the raised contact members and connect to external connectors formed on the base. The interconnect is adapted for testing a particular type of die but is interchangeable with other interconnects to permit testing of different types of dice using a universal carrier.

18 Claims, 8 Drawing Sheets

CARRIER FOR TESTING AN UNPACKAGED SEMICONDUCTOR DIE

Cross Reference to Related Applications

This application is a continuation-in-part of application Ser. No. 08/124,899 filed Sep. 21, 1993, now U.S. Pat. No. 5,495,179, which is a continuation-in-part of application Ser. No. 08/046,675, filed Apr. 14, 1993, now U.S. Pat. No. 5,367,253, which is a continuation-in-part of application Ser. No. 07/973,931 filed on Nov. 10, 1992, now U.S. Pat. No. 5,302,891, which is a continuation of application Ser. No. 07/709,858, filed Jun. 4, 1991, abandoned.

This application is related to applications Ser. No. 07/788,065 filed Nov. 5, 1991, now U.S. Pat. No. 5,440,240; Ser. No. 07/953,750 filed Sep. 29, 1992, abandoned; Ser. No. 08/073,005 filed Jun. 7, 1993, now U.S. Pat. No. 5,408,190; Ser. No. 08/073,003 filed Jun. 7, 1993; Ser. No. 08/120,628 filed Sep. 13, 1993; Ser. No. 07/896,297 filed Jun. 10, 1992, now U.S. Pat. No. 5,424,652; Ser. No. 08/192,391 filed Feb. 3, 1994, now U.S. Pat. No. 5,483,174; and, Ser. No. 08/137,675 filed Oct. 14, 1993, abandoned.

FIELD OF THE INVENTION

This invention relates to semiconductor manufacture and more particularly to a carrier suitable for holding and establishing electrical communication with an unpackaged semiconductor die. The carrier is especially useful in the manufacture and testing of known good semiconductor die (KGD).

BACKGROUND OF THE INVENTION

One of the fastest growing segments of the semiconductor industry is the manufacture of multi-chip modules (MCM). Multi-chip modules are being increasingly used in computers to form PC chip sets and in telecommunication items such as modems and cellular telephones. In addition, consumer electronic products such as watches and calculators typically include multi-chip modules.

With a multi-chip module, non-encapsulated or unpackaged dice (i.e., chips) are secured to a substrate (e.g., printed circuit board) using an adhesive. Electrical connections are then made directly to the bond pads on each die and to electrical leads on the substrate. In general, unpackaged dice cost less to manufacture than the equivalent packaged products. This is because the procedures for packaging semiconductor dice are complex and costly. Substantial cost savings are realized by eliminating packaging procedures.

However, because there is no package, procedures for testing the unpackaged dice are more difficult. With unpackaged dice semiconductor manufacturers are required to supply dice that have been tested and certified as known good die (KGD). Known-good-die (KGD) is a collective term that connotes unpackaged die having the same quality and reliability as the equivalent packaged product. This has led to a need in the art for manufacturing processes suitable for testing bare or unpackaged semiconductor die.

For test and burn-in of an unpackaged dice, a carrier replaces a conventional single chip package in the manufacturing process. The carrier typically includes an interconnect that allows a temporary electrical connection to be made between external test circuitry and the die. In addition, such a carrier must allow the necessary test procedures to be performed without damaging the die. The bond pads on a die are particularly susceptible to damage during the test procedure.

In response to the need for known good die (KGD), semiconductor manufacturers have developed carriers for testing unpackaged die. As an example, carriers for testing unpackaged die are disclosed in U.S. Pat. No. 4,899,107 to Corbett et al. and U.S. Pat. No. 5,302,891 to Wood et al., which are assigned to Micron Technology, Inc. Other test apparatus for unpackaged die are disclosed in U.S. Pat. No. 5,123,850 to Elder et al., and U.S. Pat. No. 5,073,117 to Malhi et al., which are assigned to Texas Instruments.

One of the key design considerations for a carrier is the method for establishing a temporary electrical connection with the bond pads on the die. With some carriers, the die is placed circuitry side down in the carrier and biased into contact with the interconnect. The interconnect contains the contact structure that physically aligns with and contacts the bond pads of the die. Exemplary contact structures include wires, needles, and bumps. The mechanisms for making electrical contact include piercing the native oxide of the bond pad with a sharp point, breaking or burnishing the native oxide with a bump, or moving across the bond pad with a contact adapted to scrub away the oxide. In general, each of these contact structures is adapted to form a low-resistance ohmic contact with the bondpad. Low-resistance refers to a resistance that is negligible. An ohmic contact is one in which voltage appearing across the contact is proportional to current flowing for both directions of flow.

Other design considerations for a carrier include electrical performance over a wide temperature range, thermal management, power and signal distribution, and the cost and reusability of the carrier. In addition, a carrier should be suitable for use with automated equipment and assembly procedures utilized in large scale semiconductor manufacture.

In view of the foregoing, it is an object of the present invention to provide an improved carrier adapted to test and burn-in an unpackaged die without damage to the die. It is a further object of the invention to provide an improved carrier for testing an unpackaged die, that is reusable, that is easy to assemble and disassemble, that provides efficient electrical coupling to contact locations on a die over a wide temperature range, and that can be used for testing different types of dice. It is a still further object of the present invention to provide a carrier useful in the manufacture of known good die that is compatible with automated equipment and processes used in the large scale manufacture of semiconductor dice. Other objects, advantages, and capabilities of the present invention will become more apparent as the description proceeds.

SUMMARY OF THE INVENTION

In accordance with the present invention, a carrier for testing a discrete, unpackaged semiconductor die is provided. The carrier is adapted to retain a die under test (DUT) and provide a temporary electrical connection between the die and external test circuitry. This enables burn-in and other test procedures to be performed on the die.

Several different embodiments of carriers are provided. In general, each carrier embodiment includes a carrier base having external contacts connectable to test circuitry; a temporary interconnect in electrical communication with the external contacts on the carrier base and adapted to establish a temporary electrical connection with the die. In addition to the base and temporary interconnect, each carrier includes a force distribution mechanism for biasing the die and the interconnect together in the assembled carrier. The force distribution mechanism includes a bridge plate, a spring and a pressure plate. All of the elements of the carrier are designed to permit easy assembly and disassembly of the carrier and die.

The temporary interconnect for the carrier is formed in a configuration which accommodates a particular die bondpad configuration. This permits different types of interconnects to be interchangeable to allow testing of the different types of semiconductor dice using a universal carrier. The temporary interconnect includes raised contact members for penetrating into contact locations (e.g., bond pads, test pads) on the die. A pattern of conductive traces is formed on the interconnect in electrical communication with the contact members. Each conductive trace includes a contact pad, which in the assembled carrier, are used to establish an electrical path to external circuitry.

Different contact technologies can be employed to form the temporary interconnect and contact members. As an example, the interconnect includes a silicon substrate having raised silicon contact members with oxide-penetrating projections. Alternately, the interconnect includes a rigid substrate (e.g., ceramic, silicon) and thick film contact members formed by ultrasonic forging. As another alternate, the interconnect includes a rigid substrate having microbump contact members formed on an etched film. The microbump contact members can be formed with a rough textured surface for penetrating any native oxide present on the contact location.

For assembling the carrier with a die, a temporary interconnect having a configuration of contact members corresponding to the bond pads on the die is selected and placed on a support surface of the carrier base. An electrical path is then established between the contact members on the interconnect and external contacts on the carrier base. Several different arrangements an be employed to form the electrical path. Depending on the carrier embodiment, the electrical path can be formed using external contacts that abut the interconnect, using external contacts that clip to the interconnect, or by wire bonding the external contacts to the interconnect. In addition to providing an electrical path, the external contacts function in some embodiments as a retention mechanism for securing the interconnect to the carrier base. In embodiments wherein the interconnect is wire bonded, an adhesive is used to secure the interconnect to the carrier base.

During the assembly procedure, the die is initially attached to the force distribution mechanism, typically using a vacuum. Next, the die and temporary interconnect are optically aligned using a vision system, and the die is placed into abutting contact with the interconnect with a controlled or predetermined force. This causes the contact members on the interconnect to penetrate into the contact locations on the die and establish an electrical connection. At the same time, the force distribution mechanism is attached to the carrier base to bias the die and interconnect together. The external contacts on the assembled carrier are then attached to test circuitry and the die is tested using suitable test equipment (e.g., burn-in oven and circuitry). Following the test procedures, the carrier is disassembled and the tested die is removed from the carrier.

In a first embodiment of the invention the carrier base includes external contacts formed as retention contacts. In a second embodiment of the invention the carrier base includes external contacts formed as clips. In a third embodiment of the invention the carrier base includes external contacts formed as spring-like tines encased in a plastic body. In a fourth embodiment of the invention the carrier base includes external contacts that are wire bonded to the interconnect.

DETAILED DESCRIPTION OF THE PREFERRED EMBODIMENT

Figure 1:
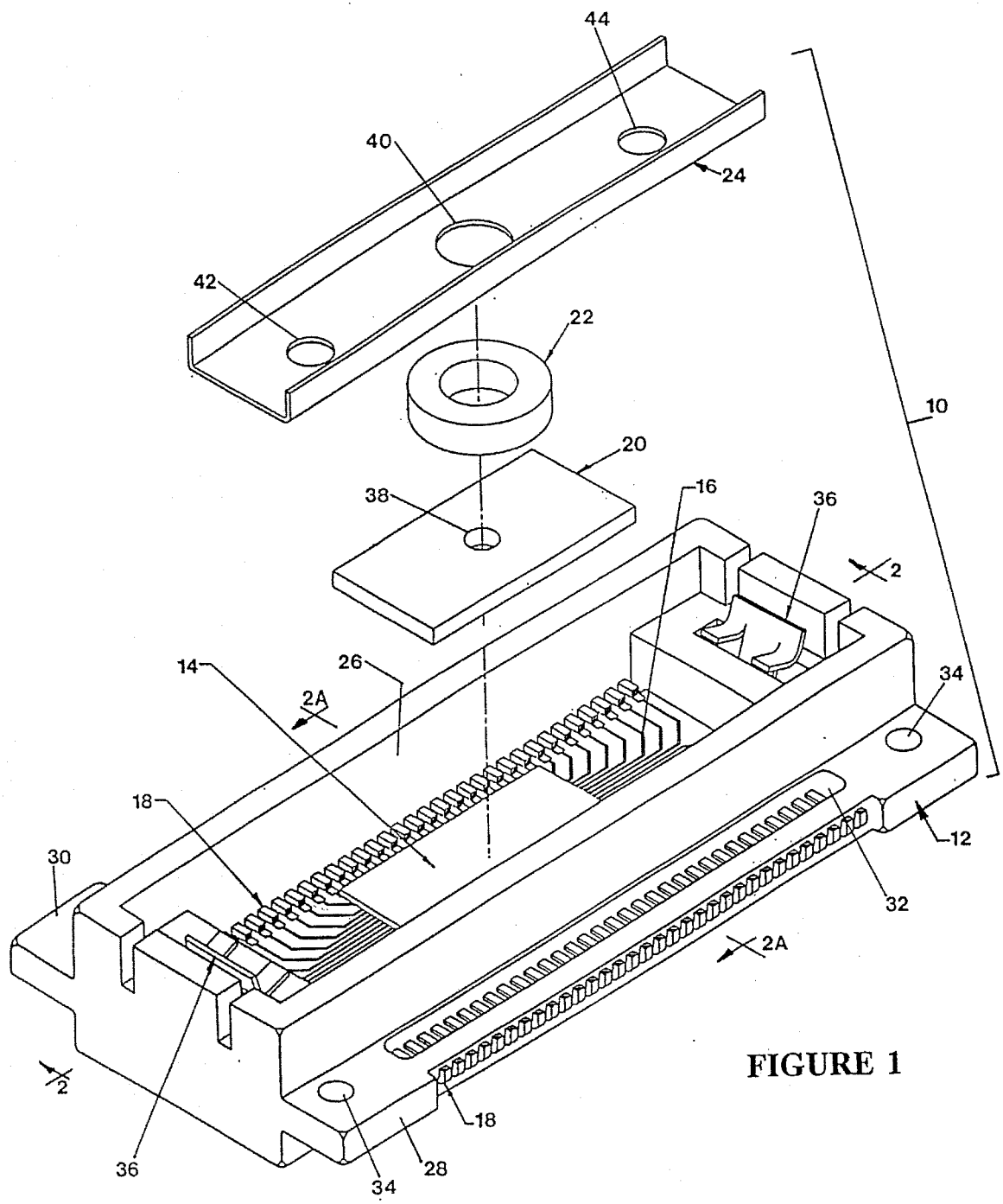
FIG. 1 is an exploded perspective view of a carrier constructed in accordance with the invention.
Figure 2:
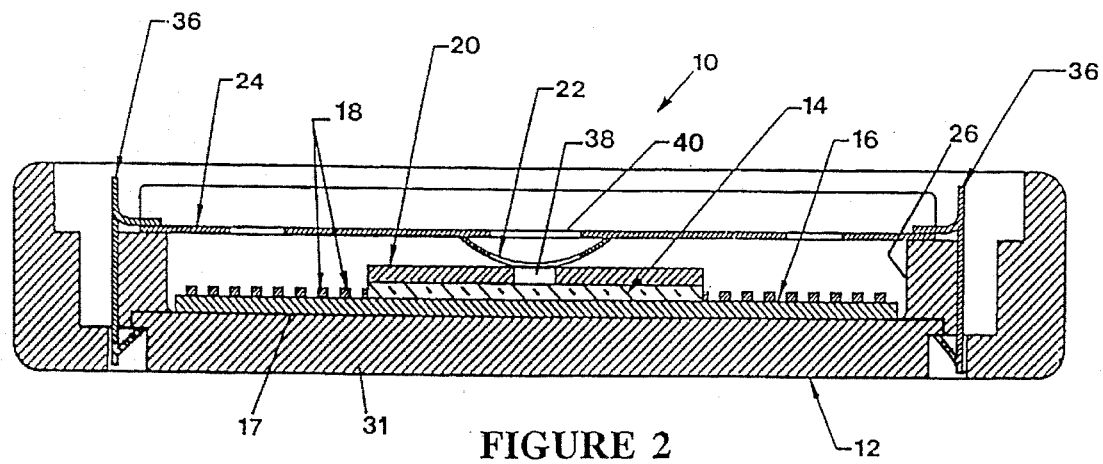
FIG. 2 is a cross section taken along section line 2—2 of FIG. 1.

Referring now to FIGS. 1 and 2, a carrier 10 constructed in accordance with the invention is shown.

The carrier 10, generally stated, includes:

a carrier base 12 adapted to retain a die 14 for testing;

a temporary interconnect 16 adapted to establish electrical communication between the die 14 and test circuitry;

a retention mechanism in the form of retention contacts 18 mounted to the carrier base 12 and adapted to retain the interconnect 16 within the carrier base 12 while establishing an electrical pathway to the interconnect 16; and a force distribution mechanism comprising a pressure plate 20, a spring 22 and a bridge plate 24 for biasing the die 14 against the interconnect 16 with an evenly distributed biasing force.

In the assembled carrier 10, the die 14 is placed circuitry (or bond pad side) down on the interconnect 16. The interconnect 16 fits within the carrier base 12 in electrical contact with the retention contacts 18. In addition, the die 14 is retained and biased into engagement with the interconnect 16 by the spring 22 acting through the pressure plate 20.

The carrier base 12 is a generally rectangular shaped block, formed of an insulative, heat-resistant material such as a ceramic or a high temperature molded plastic. The carrier base 12 is designed to be placed in a burn-in oven or other test fixture for testing the die 14. The carrier base 12 has a hollowed out interior portion which includes a cavity 26. The carrier base 12 also includes a pair of integrally formed lugs 28, 30 on either side. The lugs 28, 30 include elongated through slots 32, that extend almost from end to end of the carrier, and function to facilitate assembly of the retention contacts 18 with the carrier base 12. In addition, the lugs 28, 30 include through openings 34 for handling and securing the carrier base 12 to various assembly and test equipment.

Figure 2A:
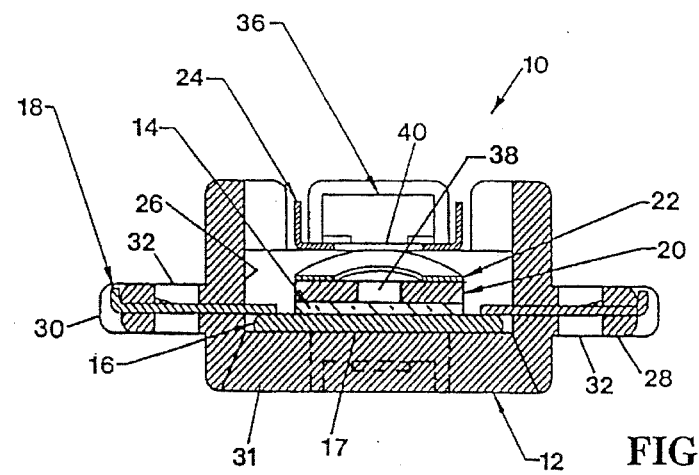
FIG. 2A is a cross section taken along section line 2A—2A of FIG. 1.

As shown in FIGS. 2 and 2A, the carrier 10 includes a bottom plate 31 that is removably mounted to the carrier base 12. A pair of clips 36 attached to the carrier base 12 secures the bottom plate 31 to the carrier base 12. The interconnect 16 is mounted to a support surface 17 of the bottom plate 31.

As also shown in FIGS. 2 and 2A, the force distribution mechanism includes the pressure plate 20, spring 22 and bridge plate 24. The pressure plate 20 is a rigid plate having an outer peripheral configuration that matches or is slightly larger that of the die 14. The pressure plate 20 includes an opening 38 which is used in the assembly of the carrier 10. As will be further explained, during assembly of the carrier 10, the opening 38 is used as a conduit for a vacuum to attach the die 14 to the pressure plate 20.

The clips 36 on the carrier base 12, in addition to securing the bottom plate 31 to the carrier base 12, also secure the bridge plate 24 to the carrier base 12. In the assembled carrier, the spring 22 is sandwiched between the bridge plate 24 and pressure plate 20 and exerts a spring force on the pressure plate 20. This spring force is evenly distributed by the pressure plate 20 over the back surface of the die 14 and biases the die 14 against the interconnect 16.

The spring 22 can be formed as a wave washer, a cylindrically curved washer, a belleville washer, a compression spring or a canted coil spring. These types of springs are commercially available from manufacturers such as ASMCO, Fairfield, N.J. and Bal Seal Engineering Company, Santa Ana, Calif.

Interconnect

Figure 3:
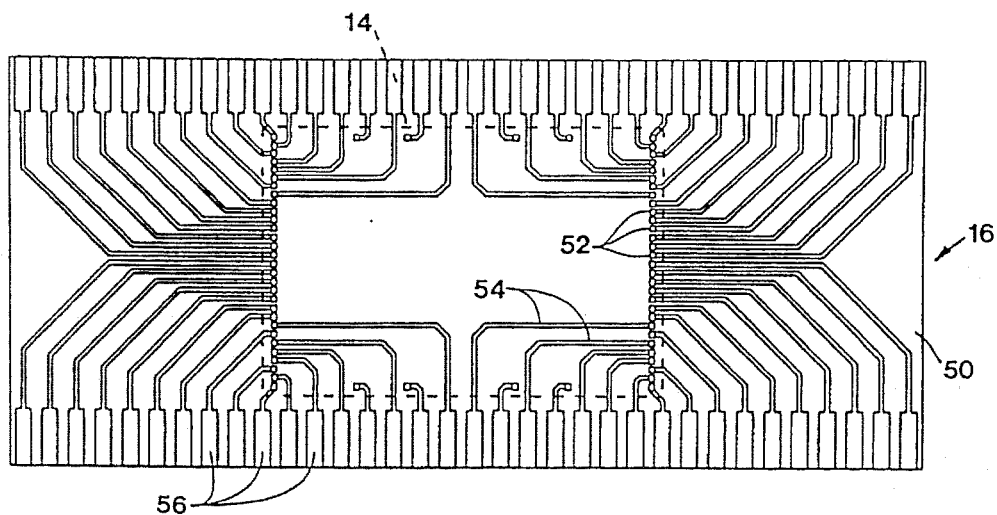
FIG. 3 is a plan view of a temporary interconnect for a carrier constructed in accordance with the invention.

Referring now to FIG. 3, the temporary interconnect 16 is shown separately. The interconnect 16 includes a substrate 50 having raised contact members 52. Each contact member 52 is connected to an electrically conductive trace 54. A contact pad 56 is formed at the end of each conductive trace 54. The raised contact members 52 are adapted to contact the bond pads 48 of the die 14 and form an electrical connection that is low resistance and ohmic. The electrically conductive traces 54 are in electrical communication with the contact members 52 and are adapted to conduct electrical signals to and from the contact members 52 and 56. In the assembled carrier 10, the contact pads 56 on the conductive traces 54 are abutted by the retention contacts 18 (FIG. 1).

Figure 3A:
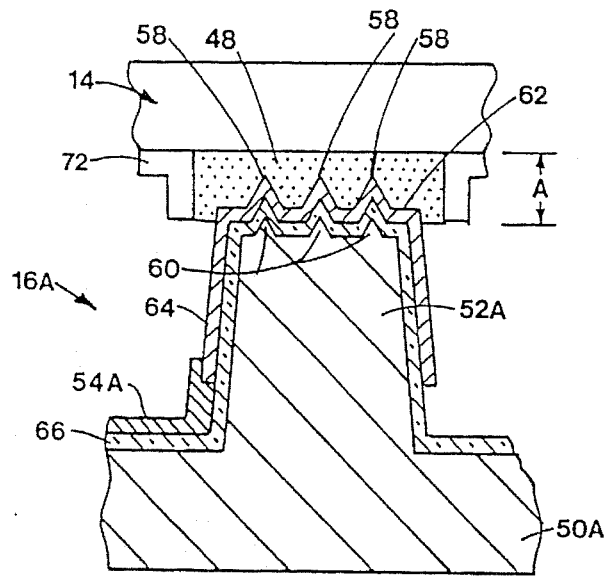
FIG. 3A is a cross section view of a self-limiting silicon contact member in one embodiment of the interconnect of FIG. 3.

The contact members 52 on the interconnect 16, are spaced in a pattern that corresponds to the placement of the bond pads 48 (FIG. 3A) on the die 14. The interconnect 16 shown in FIG. 3 is for a die having bond pads 48 formed along each end (i.e., end connect). The bond pads 48 are embedded in a protective layer 72 (FIG. 3A). Since the interconnect 16 is removable from the carrier 10, other interconnect configurations may be provided for other die bond pad configurations (e.g., peripheral, array, edge connect, lead over chip (LOC)). This permits carriers to be "universal" rather than "dedicated" to a particular die configuration.

FIGS. 3A–3D illustrate four different embodiments of the interconnect 16. In a first embodiment of the interconnect, shown in FIG. 3A, the interconnect 16A includes a silicon substrate 50A having raised contact members 52A formed with a self limiting feature as described below. Each contact member 52A is formed as a raised mesa or pillar that projects vertically upward from a surface of the silicon substrate 50A. In addition, each contact member 52A includes one or more raised projections 58 which extend from tip portions 60 of the contact member 52A. The raised projections 58 are adapted to penetrate the bond pads 48 of the die 14 and pierce through any native oxide on the bond pads to form an ohmic contact. At the same time a top surface 62 of the contact member 52A limits the penetration depth of the raised projections 58 into the bond pad 48. The height of the raised projections 58 is selected to be less than the depth "A" of a bond pad 48 (e.g., height=$\frac{1}{5}$ to $\frac{4}{5}$ of A). This arrangement permits a metal oxide layer of the bond pad 48 to be pierced through and an ohmic contact to be established while at the same time minimizing damage to the bond pad 48. The raised projections 58 of the contact member 52A may be formed as knife edges, sharp apexes, conical points or with other suitable piercing structures. In addition, the raised projections 58 may be formed directly on the substrate 50A rather than on a raised contact member 52A. In that case, the surface of the substrate 50A would limit the bond pad penetration depth of the contact member 52A.

One suitable process for forming the contact members 52A as pillars having raised projections is disclosed in U.S. Pat. No. 5,326,428 entitled "Method For Testing Semiconductor Circuitry For Operability And Method Of Forming Apparatus For Testing Semiconductor Circuitry For Operability", which is incorporated herein by reference.

The contact members 52A of the interconnect 16A include an electrically conductive layer 64 formed of a metal or metal-silicide layer. The conductive layer 64 is electrically connected to an electrically conductive trace 54A formed on the silicon substrate 50A. The conductive traces 54A may be formed on the silicon substrate 50A utilizing semiconductor circuit fabrication techniques. As an example, the conductive traces 54A may be formed of a conductive metal (e.g., aluminum, copper, or a refractory metal) by deposition, plating, patterning and etching. As another example, the conductive traces 54A may be formed of polysilicon deposited and then suitably patterned. An insulating layer 66 (e.g., $SiO_2$) formed on the substrate 50A provides electrical isolation for the traces 54A and tips 64.

Figure 2B:
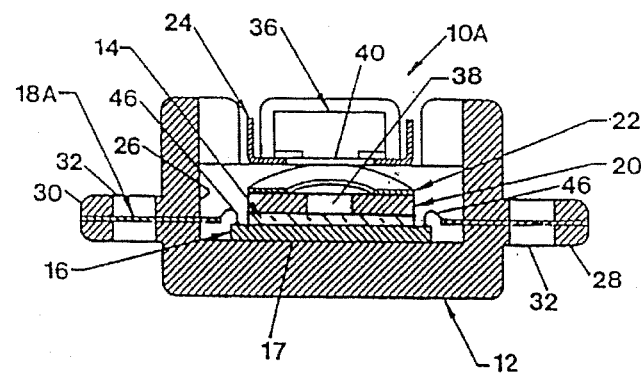
FIG. 2B is a cross section equivalent to FIG. 2A of an alternate embodiment carrier having a wire bond option.

Each conductive trace 54A terminates in a contact pad 56 (FIG. 3) formed along a longitudinal edge of the substrate 50A. The contact pads 56 are formed as a metal pad using a suitable pad metallurgy. In the assembled carrier 10 and as clearly shown in FIG. 2A, the retention contacts 18 abut the contact pads 56. This retains the interconnect 16 and establishes an electrical pathway through the retention contacts 18, through the conductive traces 54, through the contact members 52 and to the bond pads 48 of the die 14. Alternately, as shown in FIG. 2B, a carrier 10A may be assembled with the interconnect 16 wire bonded to the retention contacts 18A using thin wires 46. With the wire bond option, bonding sites may be formed on the retention contacts 18A and contact pads 56 of the interconnect using an appropriate pad metallurgy.

Figure 3B:
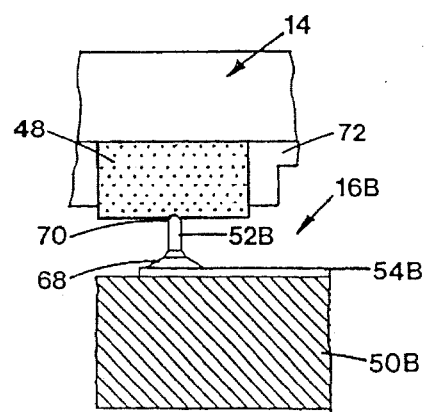
FIG. 3B is a cross sectional view of a thick film contact member in another embodiment of the interconnect of FIG. 3.

Referring now to FIG. 3B, another embodiment of the interconnect 16 is shown. Interconnect 16B includes thick film contacts 52B formed on an electrically non-conductive, rigid substrate 50B. The electrically non-conductive, rigid substrate 50B can be formed of a ceramic, silicon, silicon-on-sapphire, silicon-on-glass, or germanium material. The interconnect 16B also includes conductive traces 54B formed on the substrate 50B in electrical communication with the thick film contact members 52B.

Each contact member 52B is formed with a conical base 68 in electrical contact with the conductive trace 54B and a tip 70 adapted to penetrate into the bond pad 48 on the die 14. One suitable process for forming the thick filmed contact members 52B is ultrasonic forging. U.S. Pat. No. 5,249,450, entitled "Probehead For Ultrasonic Forging", which is incorporated herein by reference describes such a process.

Figure 3D:
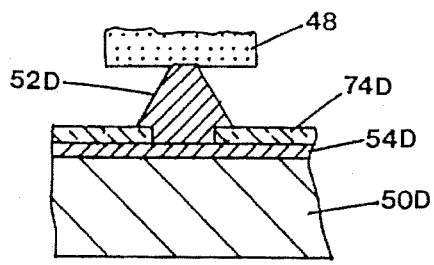
FIG. 3D is a cross sectional view of another microbump contact member in another embodiment of the interconnect of FIG. 3.
Figure 3C:
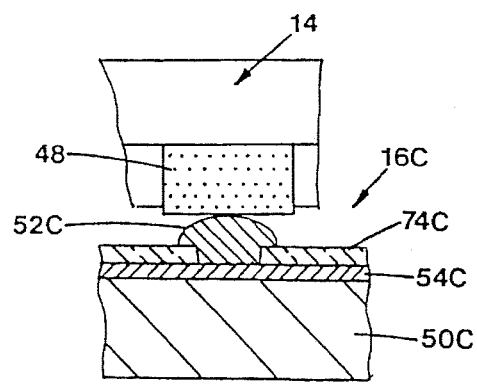
FIG. 3C is a cross sectional view of a microbump contact member in another embodiment of the interconnect of FIG. 3.
Figure 3E:
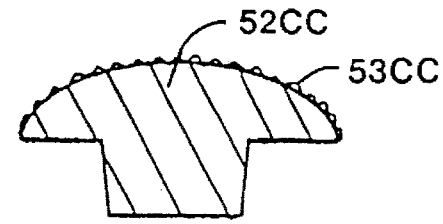
FIG. 3E is a cross sectional view equivalent to FIG. 3C of a microbump contact.
Figure 3F:
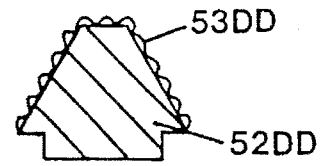
FIG. 3F is a cross sectional view equivalent to FIG. 3 of a microbump contact member with a rough plated surface.

Referring now to FIG. 3C, a third embodiment of the interconnect 16 is shown. In the third embodiment, the interconnect 16C includes a rigid substrate 50C having microbump contact members 52C formed on an etched polyimide/copper tape 74C. Microbump contact technology, which is used for Tape Automated Bonding (TAB), employs a nonconductive and electrically insulating tape (e.g., polyimide) having a metallic foil (e.g., Cu) attached thereto. The metallic foil is patterned and etched to form electrically conductive traces. Holes are etched through the tape in contact with the conductive traces. Metal bumps (e.g., Ni, Cu) are formed in the holes in contact with the conductive traces. Typically, the metal bumps are placed into contact with the bond pads of a die and bonded to establish a permanent electrical connection. As an example, U.S. Pat. No. 4,899,207 discloses a method of tape automated bonding that utilizes microbump contacts. In addition, microbump contacts are commercially available from Nitto Denko America, Inc. and are sold under the trademark ASMAT™. Microbump contacts are also commercially available from Packard-Hughes Interconnect, Irvine, Calif. and are sold under the trademark Gold Dot™.

For forming the interconnect 16C, the polyimide tape 74C having microbump contact members 52C, is attached to a rigid substrate 50C. An adhesive may be used to secure the polyimide tape 74C to the rigid substrate 50C. The rigid substrate 50C may be formed of a material such as silicon, germanium, silicon-on-sapphire, silicon-on-glass, or a ceramic. The microbump contact members 52C are formed on the polyimide tape 74 in contact with a metallic foil which is patterned to form conductive traces 54C. In the illustrative embodiment, the microbump contact members 52C are formed with a hemispherical or convex shape and are adapted to contact the flat bond pads 48 of the die 14. For bond pads formed with a raised surface such as a bump, the microbump contact members may be formed in a concave shape. In a similar manner, rectangular or square shaped raised bond pads may be accommodated with a mating indentation.

With reference to FIG. 3CC, a microbump contact member 52CC can include a rough textured surface 53CC to facilitate penetration of the oxide coating on the bondpad 48. The textured surface 53CC can be formed using an electrolytic plating process to deposit a rough layer of material. For a microbump contact member 52CC formed of a material such as nickel, the textured surface 53CC will be formed of a material such as molybdenum, tungsten, platinum, iridium or gold, which has a more positive electromotive potential than nickel. In some applications, the textured surface 53CC may be formed of nickel. Alternately the textured surface 53C can be formed by etching the contact member 52CC using a wet or dry etching process. By way of example, for a microbump contact member 52CC having a diameter of about 30μ, the textured surface 53CC will include oxide penetrating asperities on the order of about 5000Å or less in height.

FIG. 3D illustrates a microbump contact member 52D formed in a conical shape with a flat tip. FIG. 3DD illustrates the same contact member 52DD with a textured surface 53DD.

Assembly

Prior to the assembly procedure, the interconnect 16 is placed on the support surface 17 (FIG. 2) of the bottom plate 31. The bottom plate 31 is then secured to the carrier base 12 using the clips 26. At the same time, the retention contacts 18 abut the interconnect 16 and establish electrical communication between the retention contacts 18 and the contact members 52 (FIG. 3) on the interconnect 16.

Briefly, during the assembly procedure, the die 14 is attached to the pressure plate 20, and the die 14 and interconnect 16 are aligned using optical alignment techniques. The pressure plate 20 and die 14 are then lowered to place the die 14 into contact with the interconnect 16. At the same time the bridge plate 24 is secured to the carrier base 12 for biasing the die 14 and interconnect 16.

During the assembly procedure, the bond pads 48 (FIG. 3A) on the die 14 are aligned with the contact members 52 on the interconnect 16. This can be accomplished using alignment techniques similar to those used for flip chip bonding. Flip chip bonding refers to a process wherein a semiconductor die is placed face down on a substrate, such as a printed circuit board, and the bond pads on the die are bonded to connection points on the substrate. Tools for flip chip bonding are sometimes referred to as aligner bonders. An aligner bonder and method of optical alignment for flip chip bonding are described in U.S. Pat. No. 4,899,921 to Bendat et al, entitled "Aligner Bonder" which is incorporated herein by reference. Such an aligner bonder is available from Research Devices of Piscataway, N.J.

Figure 4:
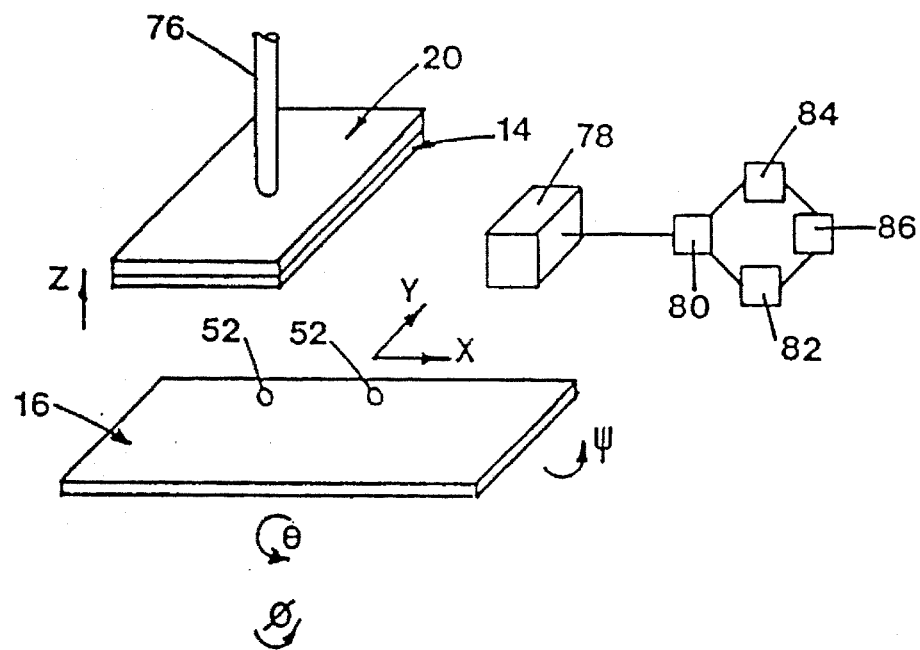
FIG. 4 is a schematic view illustrating a procedure for aligning a die under test and the interconnect shown in FIG. 3 during assembly of a carrier constructed in accordance with the invention.

In the present case an aligner bonder may be modified to provide an assembly apparatus for use in assembling the carrier 10. FIG. 4 illustrates the alignment step of the assembly procedure using such an apparatus. With reference to FIG. 4, an assembly tool 76 is connected to a vacuum source (not shown). The assembly tool 76 is adapted to attach the die 14 to the pressure plate 20 by directing a vacuum through the opening 38 (FIG. 2) in the pressure plate 20. The assembly tool 76 is movable along the z-axis in either direction. An optical probe 78 is movable from one location to another to explore aligned portions of the die 14 and interconnect 16. The optical probe is in light communication with optics 80 and video cameras 82, 84 for providing video images of the opposing surfaces. These images are displayed on a display monitor 86.

The interconnect 16 is supported by an adjustable support (not shown) movable along x, y and z axes, in a rotational direction Θ (theta) and in angles of inclination φ and ψ. By moving the adjustable support as required, the bond pads 48 (FIG. 3A) on the die 14 can be aligned with the contact members 52 on the interconnect 16. In addition, by using reference marks, adjustment of angles of inclination φ and ψ can be used to achieve parallelism of the surfaces of the die 14 and interconnect 16.

Following alignment of the die 14 and interconnect 16, the assembly tool 76 is adapted to move the die 14 and pressure plate 20 along the z axis towards the interconnect 16 to place the contact members 52 of the interconnect 16 into contact with the bond pads 48 of the die 14. The assembly tool 76 is also adapted to exert a contact force of a predetermined magnitude on the pressure plate 20 and die 14 so that the contact members 52 on the interconnect 16 penetrate the bond pads 14 to establish an electrical connection that is low resistance and ohmic.

As the die 14 is placed in contact with the interconnect 16, the bridge plate 24 and spring 22 are attached to the carrier base 12 (FIG. 2). The assembly tool 76 may include mechanisms (not shown) to facilitate assembly of the bridge plate 24 and spring 22 with the carrier base 12 as the die 14 and interconnect 16 are placed in contact. The bridge plate 24 is then secured to the carrier base 12 using clips 36. A spring force is exerted by the spring 22 and evenly distributed across the die 14 by the pressure plate 20. The size, material and structure of the spring 22 is selected to provide a predetermined biasing force.

Alternate Embodiment (C-shaped contacts)

Figure 5:
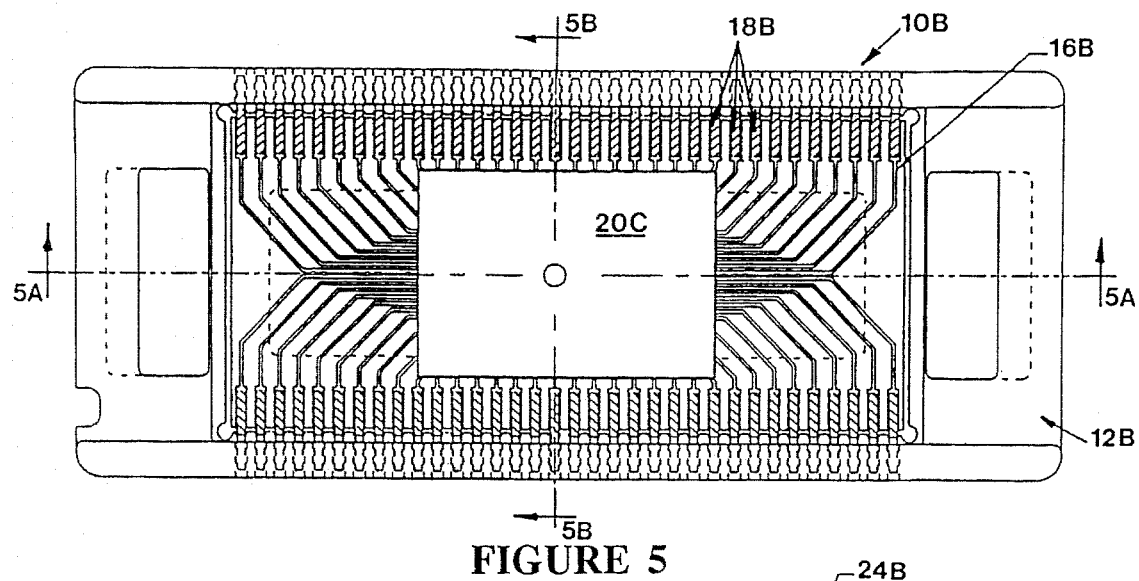
FIG. 5 is a plan view of an alternate embodiment carrier shown with a bridge plate component removed and having a retention mechanism with clip-like contacts that clip directly to the carrier base.
Figure 5A:
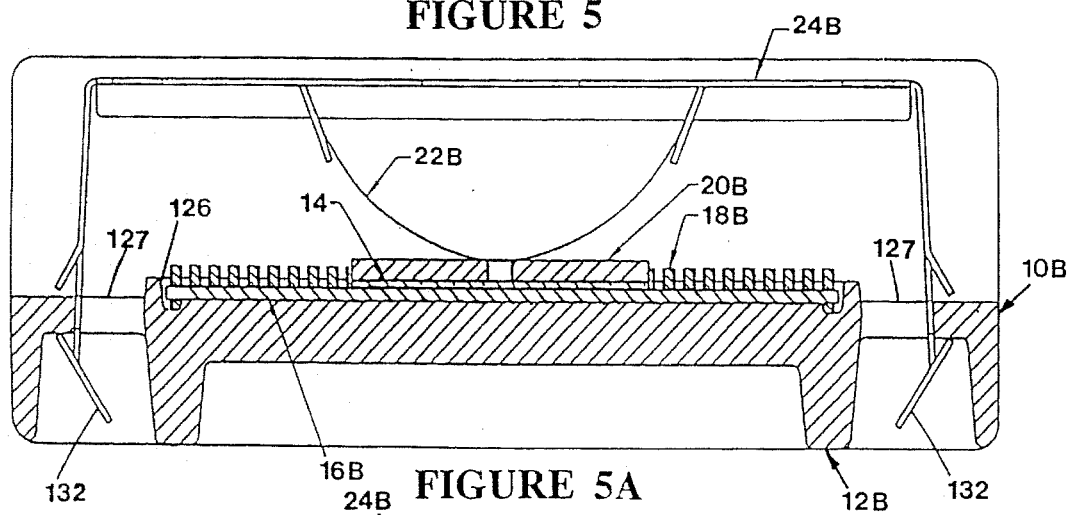
FIG. 5A is a cross section taken along section line 5A—5A of FIG. 5.
Figure 5B:
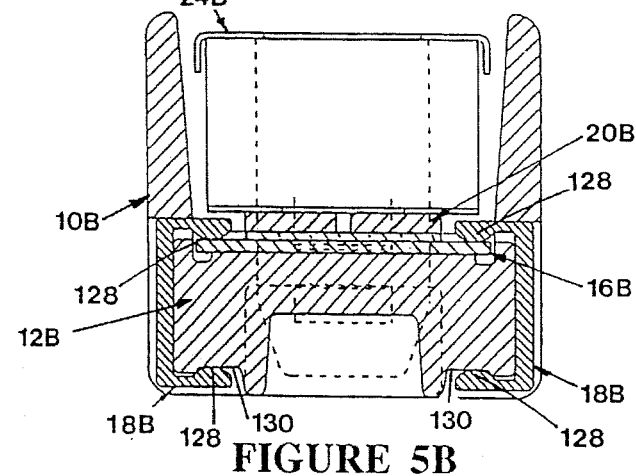
FIG. 5B is a cross section taken along section line 5B—5B of FIG. 5.

Referring now to FIGS. 5–5B, an alternate embodiment carrier 10B is shown. Carrier 10B is similar in construction to the carrier described in parent application Ser. No. 08/124,899, now U.S. Pat. No. 08/124,899, which is incorporated herein by reference. Carrier 10B includes a carrier base 12B, an interconnect 16B, C-shaped contacts 18B for securing the interconnect 16B to the carrier base 12B, a pressure plate 20B, a spring 22B and a bridge clamp 24B.

The carrier base 12B includes a recess 126 wherein the interconnect 16B is retained. In addition, the carrier base 12B includes openings 127 formed as elongated slots for attaching the bridge clamp 24B to the base 12B. The carrier base 12B is molded with a cross sectional configuration that permits the C-shaped contacts 18B to be snapped or clipped directly to the carrier base 12B. This cross sectional configuration is clearly shown in FIG. 5B.

As also shown in FIG. 5B, the C-shaped contacts 18B include rounded edges 128 which are adapted to abut the contact pads 56 (FIG. 3) on interconnect 16B and a bottom surface 130 of the carrier base 12B. As with the retention contacts 18 (FIG. 1) previously described, the C-shaped contacts 18B are pressed into openings formed in the carrier base 12B and are adapted for connection to external test circuitry. The C-shaped contacts 18B thus not only function to secure the interconnect 18B to the carrier base 12B but also to establish an electrical pathway to the contact members 52 (FIG. 3) of the interconnect 18B.

The bridge clamp 24B, spring 22B and pressure plate 20B function substantially the same as the equivalent elements previously described. The bridge clamp 24B includes tabs 132 (FIG. 5A) that fit through the openings 127 in the carrier base 12B to secure the bridge clamp 24B to the carrier base 12B. The assembly and function of the carrier 10B is otherwise substantially the same as for the carriers 10 and 10A as previously described.

Alternate Embodiment (Tine Contacts)

Figure 6:
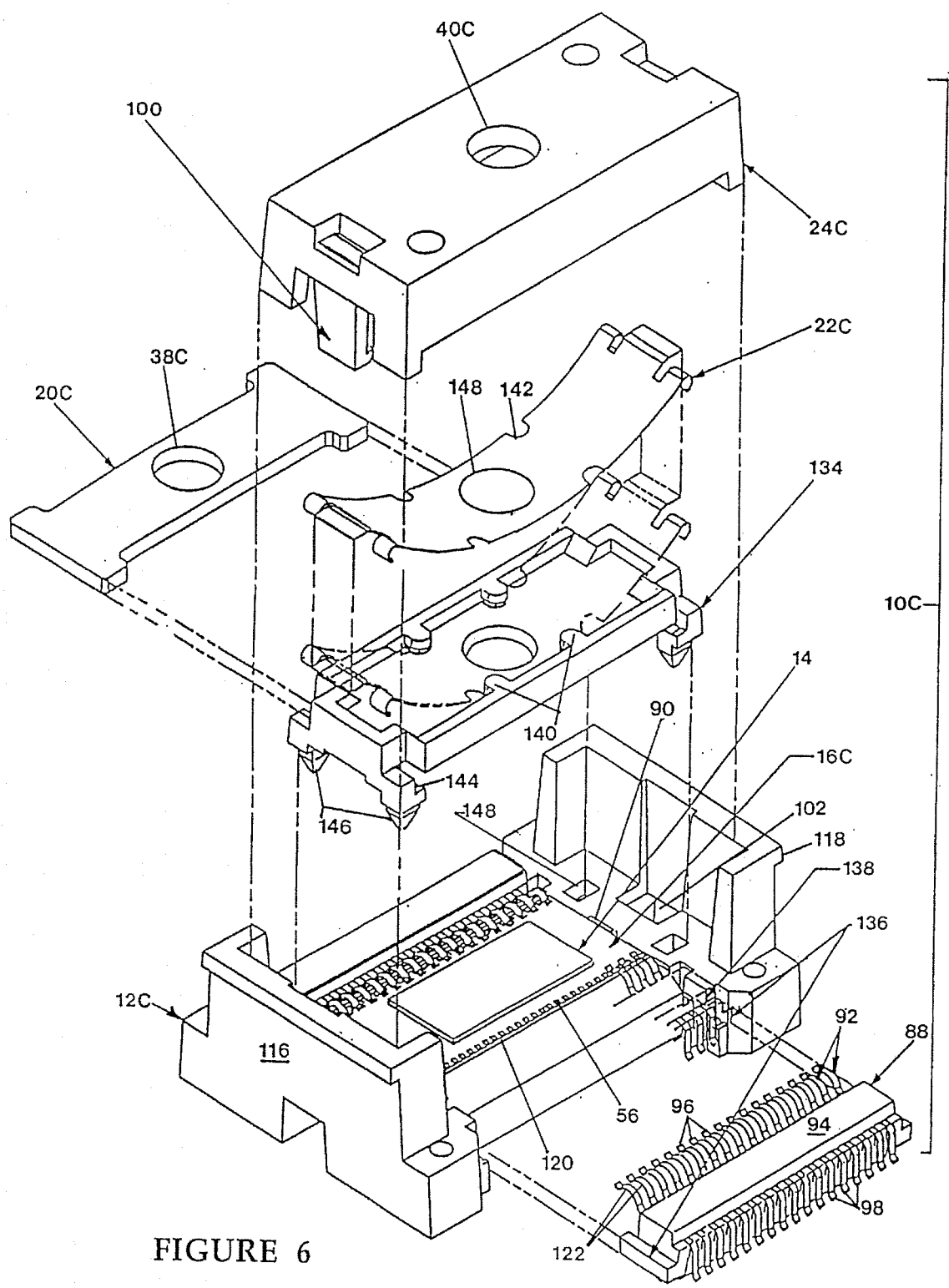
FIG. 6 is an exploded perspective view of an alternate embodiment carrier constructed in accordance with the invention with tine contacts embedded in a plastic body.

Referring now to FIGS. 6, an alternate embodiment carrier 10C is shown. Carrier 10C includes a carrier base 12C, a pressure plate 20C, a spring 22C and a bridge plate 24C. In addition, the carrier 10C includes a holder 134 for the pressure plate 20C and a pair of retention mechanisms 88 for retaining and establishing electrical contact with the interconnect 16C.

The carrier base 12C is a generally U-shaped molded plastic block and includes side walls 116, 118 and a support surface 120 for the interconnect 16C. The support surface 120 of the carrier base 12C includes a pair of raised tabs 90 adapted to contact edges of the interconnect 16C to prevent the interconnect 16C from sliding.

The retention mechanisms 88 are adapted to removably attach to the carrier base 12C to retain the interconnect 16C and at the same time establish electrical communication with the interconnect 16C. The retention mechanisms 88 include parallel spaced tine contacts 92 formed of an electrically conductive metal. The tine contacts 92 include a tip portion 96 adapted to contact the contact pads 56 on the interconnect 16 and a base portion 98 adapted for connection to external test circuitry (not shown). Each tip portion 96 of the tine contacts 92 is formed at the end of a convex section 122 which functions as a spring member to bias the tip portion 96 against a respective contact pad 56 on the interconnect 16C.

The tine contacts 92 can be formed by stamping or otherwise shaping a sheet of metal. The tine contacts 92 are encased in a molded plastic body. The molded plastic bodies 94 of the retention mechanisms 88 are formed with a slide bar 136 adapted to slide over a mating contact slot 138 formed in the carrier base 12C. The retention mechanisms 88 permit easy disassembly and assembly of the carrier base 12C with the interconnect 16C. Different configurations of interconnects 16C and retention mechanisms 88 can thus be used with dice having different bond pad configurations.

In addition to the carrier base 12C, interconnect 16C, and retention mechanisms 88, the carrier 10C includes the pressure plate 20C, spring 22C and bridge plate 24C which function as a force distribution mechanism substantially as previously described for carrier 10C. One difference is the holder 134 that is adapted to hold the pressure plate 20C and spring 22C. As shown with phantom lines, the spring 22C and pressure plate 20C attach to the holder 134 to form a subassembly. The holder 134 includes four tabs 140 that align with mating slots 142 on the spring 22C. For attaching the spring 22C to the holder 134, the tabs 140 are aligned with the slots 142 and the spring 22C is slid under the tabs 140. The pressure plate 20C is retained on side rails 144 formed on the holder 134. The holder 134 includes four pointed latch members 146 that attach to mating recesses 148 formed in the carrier base 12C.

In the assembled carrier 10C, latches 100 formed on the bridge plate 24C fit within recesses 102 on the carrier base 12C to secure the bridge plate 24C to the carrier base 12C. In the assembled carrier 10C, the spring 22C and pressure plate 20C exert a biasing force on the die 14 and interconnect 16C. A central opening 40C in the bridge plate 24C, an opening 38C in the pressure plate 20C and an opening 148 in the spring 22C function as previously described for aligning the die 14 and interconnect 16 using an assembly tool 76 (FIG. 4).

Alternate Embodiment (Wire Bonding)

Figure 7:
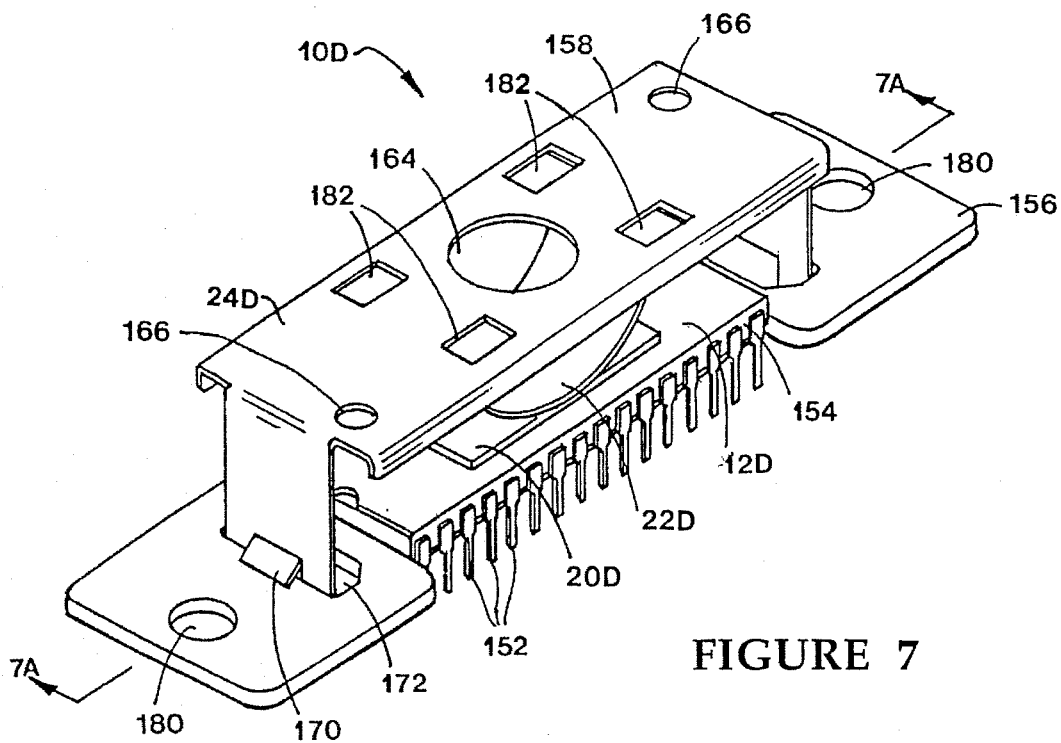
FIG. 7 is a perspective view of an alternate embodiment carrier having an interconnect that is wire bonded to external contacts on the carrier body.
Figure 7A:
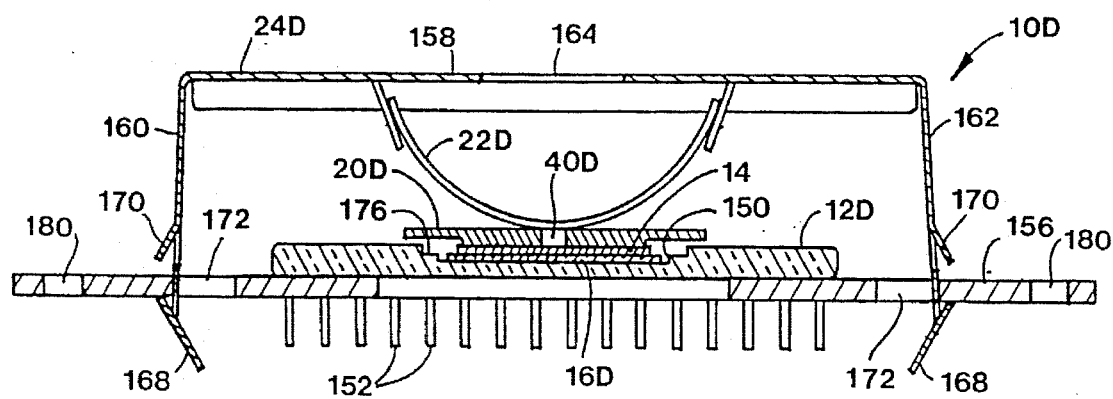
FIG. 7A is a cross sectional view taken along section line 7A—7A of FIG. 7.
Figure 7B:
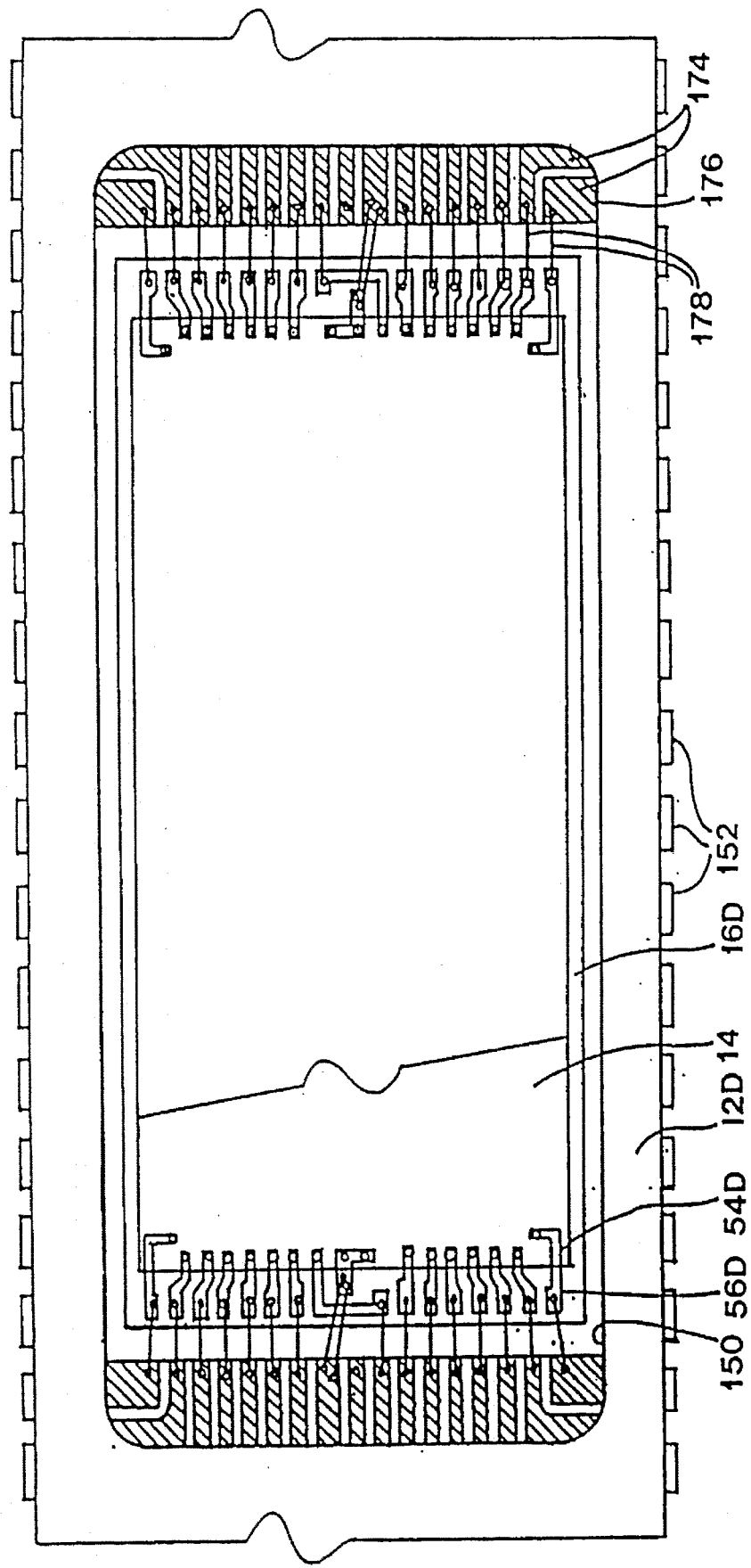
FIG. 7B is a cross sectional plan view of the interconnect for the carrier shown in FIG. 7 shown with the force distribution mechanism and pressure plate removed.

Referring now to FIGS. 7–7B, another alternate embodiment carrier 10D is shown. The carrier 10D includes a carrier base 12D, an interconnect 16D that is wire bonded to the carrier base 12D and a force distribution mechanism including a bridge plate 24D, a spring 22D and a pressure plate 20D.

The carrier base 12D is a generally rectangular shaped, block-like structure, formed of an insulative, heat-resistant, material such as a ceramic or a high temperature molded plastic. The carrier base 12D includes a cavity 150 that is sized and shaped to retain the interconnect 16D.

The carrier base 12D is formed with an arrangement of external connectors 152 along each longitudinal edge 154. The connectors 152 are adapted for connection to external test circuitry using a test socket (not shown) or other arrangement. The connectors 152 are arranged in the configuration of the external leads of a dual in-line package (DIP). This arrangement, however, is merely exemplary as other lead configurations such as leadless chip carrier (LCC) are also possible. As will be further explained, an electrical pathway is established between the connectors 152 and the interconnect 16A by wire bonding.

In the assembled carrier, the carrier base 12D is secured to a carrier tray 156 using an adhesive. Also in the assembled carrier, the bridge clamp 24D functions to bias the pressure plate 20D and die 14 against the interconnect 16D held within the carrier base 12D. The carrier base 12D and carrier tray 156 may also include some type of aligning or interlocking arrangement (not shown) to facilitate the assembly of these components. The carrier tray 156 includes openings 180 to facilitate automated handling.

As shown in FIG. 7A, the bridge clamp 24D is a generally u-shaped structure that includes a top portion 158 and sides 160, 162. As shown in FIG. 7, the top portion 158 of the bridge clamp 24D includes various apertures including a central aperture 164, and lateral apertures 166. As will be more fully explained, the apertures 164, 166 facilitate handling during assembly and disassembly of the carrier 12D. The bridge clamp 24D also includes downwardly extending tabs 182 for mounting the spring 22D.

The bridge clamp 24D is formed of an elastically deformable material such as steel. The sides 160, 162 of the bridge clamp 24D are formed with tab members 168. The tab members 168 are adapted to be placed through slots 172 in the carrier tray 156 to abut the underside of the carrier tray 156. The spacing of the sides 160, 162 of the bridge clamp 24D and slots 172 in the carrier tray 156 is such that in the assembled carrier 24D a lateral force is generated by the sides 160, 162 for biasing the tabs 168 against the carrier tray 156. Conversely, by pressing inwardly on the sides 160, 162, the tabs 168 can be moved towards one another for disengaging the bridge clamp 24D from the carrier tray 156. Another set of tabs 170 limit the downward axial movement of the bridge clamp 24D.

FIG. 7B illustrates the wire bonding of the interconnect 16D to the carrier base 12D. Each conductive trace 54D includes (or is attached to) a bonding site 56D for wire bonding to a corresponding bonding site 174 on the carrier base 12D. The bonding sites 174 on the carrier base 12D are attached to circuit traces (not shown) in electrical communication with the external connectors 152 of the carrier base 12D. Bond wires 178 are wire bonded to the bonding sites 174 on the interconnect 16D and to the bonding sites 174 on the carrier base 12D using techniques that are known in the art. The carrier base 12D is formed with a stepped bond shelf 176 that facilitates the wire bonding process.

The carrier 10D is assembled substantially as previously described for carriers 10, 10A, 10B and 10C. In addition, carrier 10D functions the same as the carriers previously described.

Thus the invention provides several carrier embodiments adapted to test a discrete, unpackaged semiconductor die in the manufacture of known good die. In each of the illustrative embodiments, the carrier includes an interchangeable interconnect and a retention mechanism for securing and establishing electrical communication with the interconnect. Each carrier also includes a force distribution mechanism adapted to bias the die against the interconnect with an evenly distributed force. Moreover, an electrical connection is formed with bond pads on the die using contact members formed on the interconnect as either self-limiting silicon pillars, thick film contacts or microbumps.

While the invention has been described with reference to certain preferred embodiments, as will be apparent to those skilled in the art, certain changes and modifications can be made without departing from the scope of the invention as defined by the following claims.

What is claimed is:

1. An apparatus for testing an unpackaged semiconductor die comprising:

a base formed with sidewalls and a cavity;

a plate with a support surface, said plate adapted for attachment to the base such that the support surface is contained within the cavity;

an interconnect mounted to the support surface, said interconnect including a substrate and a contact member formed on the substrate adapted to contact a contact location on the die, and a conductive trace in electrical communication with the contact member;

an external retention contact mounted to the base and extending into the cavity for contacting the conductive trace as the plate is attached to the base to retain the interconnect on the support surface and to establish electrical communication between the conductive trace and test circuitry; and a force distribution mechanism clipped to the base for biasing the die and interconnect together.

2. The apparatus as claimed in claim 1 and wherein the interconnect is interchangeable with other interconnects to permit testing of different types of die using the carrier.

3. The apparatus as claimed in claim 1 and wherein the retention contact is adapted to press against the conductive trace on the interconnect at a first end and to electrically connect to test circuitry at a second end.

4. The apparatus as claimed in claim 1 and wherein the force distribution mechanism includes a pressure plate for contacting the die, a bridge plate attachable to the base and a spring sandwiched between the pressure plate and bridge plate.

5. The apparatus as claimed in claim 4 and wherein the pressure plate and bridge plate each include an aperture to permit the die to be attached to the pressure plate using an assembly tool.

6. The apparatus as claimed in claim 1 and wherein the contact member on the interconnect is formed as a mesa with a raised projection adapted to penetrate the contact location on the die to a penetration depth.

7. The apparatus as claimed in claim 1 and wherein the contact member on the interconnect is formed as a thick film contact using an ultrasonic forging process and the substrate is a material selected from the group consisting of silicon, ceramic, silicon-on-glass, silicon-on sapphire, and germanium.

8. The apparatus as claimed in claim 1 and wherein the contact member on the interconnect is a microbump contact mounted to a flexible tape and attached to the substrate.

9. A carrier for testing an unpackaged semiconductor die, comprising:

a carrier base having a cavity;

a plate with a support surface, said plate adapted for attachment to the base such that the support surface is contained within the cavity;

an interconnect mountable to the support surface, said interconnect comprising a substrate having a raised contact member adapted to penetrate a contact location on the die, said interconnect further comprising an electrically conductive trace in electrical communication with the contact member and terminating in a contact pad;

an external retention contact attached to the carrier base and extending into the cavity to abut the contact pad as the plate is attached to the base to retain the interconnect and establish electrical communication between the contact member on the interconnect and test circuitry; and a force distribution mechanism for biasing the interconnect and die together, said force distribution mechanism including a pressure plate for abutting the die, a bridge plate clipped to the base and a spring sandwiched between the pressure plate and bridge plate for exerting a biasing force on the pressure plate.

10. The carrier as claimed in claim 9 and further comprising a second interconnect interchangeable with the interconnect to permit testing of another semiconductor die having a different configuration than the die.

11. The carrier as claimed in claim 9 and wherein the spring is formed as a spring member selected from the group consisting of wave washer, cylindrically curved washer, belleville washer, compress ion spring, and canted coils spring.

12. The carrier as claimed in claim 9 and wherein the substrate is formed of silicon and the contact members are formed as raised mesas having raised self-limiting projections.

13. The carrier as claimed in claim 9 and wherein the contact members have a conical base and a tip formed by an ultrasonic forging process.

14. The carrier as claimed in claim 9 and wherein the contact members are formed as microbumps mounted on an etched tape.

15. The carrier as claimed in claim 14 and wherein the contact members include a rough textured surface.

16. A carrier for testing an unpackaged semiconductor die, comprising:

a base having a cavity;

a plate with a support surface, said plate adapted for attachment to the base such that the support surface is contained within the cavity;

an interconnect placed on the support surface, said interconnect including raised contact members formed on a substrate and a pattern of conductive traces in electrical communication with the raised contact members, with the raised contact members adapted to penetrate contact locations on the die and the interconnect interchangeable with a second interconnect adapted to test a second die;

a plurality of external retention contacts attached to the base and extending into the cavity for contacting and retaining the interconnect on the support surface as the plate is attached to the base and for establishing an electrically conductive path between the circuit traces and test circuitry; and a force distribution mechanism removably clipped to the base for exerting a biasing force on the die, said force distribution mechanism including a spring sandwiched between a pressure plate that presses against the die and a bridge clamp attached to the base.

17. The carrier as claimed in claim 16 and wherein the carrier base includes side walls and the retention contacts mount to the side walls.

18. The apparatus as claimed in claim 16 and wherein the contact member on the interconnect is formed as a mesa with a raised projection adapted to penetrate the contact location on the die to a penetration depth.

* * * * *